United States Patent
Pan et al.

(10) Patent No.: US 9,543,176 B2
(45) Date of Patent: Jan. 10, 2017

(54) OPERATING METHODS OF PURGE DEVICES FOR CONTAINERS

(71) Applicant: GUDENG PRECISION INDUSTRIAL CO., LTD, New Taipei (TW)

(72) Inventors: Yung-Chin Pan, New Taipei (TW); Shun-Sheng Chiu, New Taipei (TW)

(73) Assignee: GUDENG PRECISION INDUSTRIAL CO., LTD., New Taipei (TW)

( * ) Notice: Subject to any disclaimer, the term of this patent is extended or adjusted under 35 U.S.C. 154(b) by 13 days.

(21) Appl. No.: 14/801,823

(22) Filed: Jul. 16, 2015

(65) Prior Publication Data

US 2016/0276187 A1 Sep. 22, 2016

(30) Foreign Application Priority Data

Mar. 20, 2015 (TW) ............................. 104109047 A

(51) Int. Cl.
*F26B 21/06* (2006.01)
*H01L 21/673* (2006.01)

(52) U.S. Cl.
CPC ............................. *H01L 21/67389* (2013.01)

(58) Field of Classification Search
CPC ........... F26B 19/00; F26B 21/00; F26B 21/06; F26B 23/00; B08B 7/00; B08B 7/04; G03F 1/00; G03F 1/82; G01K 9/00
USPC ............... 34/77, 78; 134/6, 904; 15/77, 102; 438/689; 219/388
See application file for complete search history.

(56) References Cited

U.S. PATENT DOCUMENTS

| | | | | |
|---|---|---|---|---|
| 5,651,193 A * | 7/1997 | Rhodes | ................ | F26B 25/009 34/531 |
| 6,067,727 A * | 5/2000 | Muraoka | ........... | H01L 21/68728 34/317 |
| 6,212,789 B1 * | 4/2001 | Kato | ................ | H01L 21/67051 134/902 |
| 6,935,050 B2 * | 8/2005 | Bookbinder | .............. | C01B 7/07 34/416 |
| 7,144,813 B2 * | 12/2006 | Wirth | ................ | H01L 21/67109 219/388 |
| 7,797,855 B2 * | 9/2010 | Fukuoka | ................ | C30B 33/02 118/709 |
| 7,980,003 B2 * | 7/2011 | Aoki | ................ | H01L 21/67109 34/443 |
| 8,534,079 B2 * | 9/2013 | Brooks | ................... | F25D 3/105 62/151 |
| 2011/0180108 A1 * | 7/2011 | Pan | ........................... | G03F 1/66 134/21 |
| 2013/0205611 A1 * | 8/2013 | Wamura | ................. | F26B 19/00 34/60 |

(Continued)

FOREIGN PATENT DOCUMENTS

| JP | 5482196 B2 * | 4/2014 | ............. | C23C 16/34 |
|---|---|---|---|---|
| KR | 101425253 B1 * | 8/2014 | ............. | C23C 16/34 |

*Primary Examiner* — Stephen M Gravini
(74) *Attorney, Agent, or Firm* — Cheng-Ju Chiang

(57) ABSTRACT

Operating methods of purge devices for containers are provided. The operating methods comprise a step of aligning an opening of a container to a first purging unit and placing the container in the purge device. After the container is purged, the container will be heated and filled with extreme clean dry air (XCDA) or nitrogen to finalize the purging process.

10 Claims, 11 Drawing Sheets

(56) References Cited

U.S. PATENT DOCUMENTS

| | | | |
|---|---|---|---|
| 2014/0137890 A1* | 5/2014 | Pan | B08B 1/00 |
| | | | 134/6 |
| 2014/0291942 A1* | 10/2014 | Wang | H01L 21/68785 |
| | | | 279/142 |
| 2015/0184294 A1* | 7/2015 | Kato | C23C 16/34 |
| | | | 118/697 |

* cited by examiner

OPERATING METHODS OF PURGE DEVICES FOR CONTAINERS

CROSS-REFERENCE TO RELATED APPLICATION AND CLAIM OF PRIORITY

This application claims the benefit of Taiwan Patent Application No. 104109047, filed on Mar. 20, 2015, in the Taiwan Intellectual Property Office, the disclosure of which is incorporated herein in its entirety by reference.

TECHNICAL FIELD

At least one embodiment of the present invention relates to operating methods of purge devices for containers. More particularly, the operating methods are used to purge, heat, and dry containers used in semiconductor industry.

DESCRIPTION OF THE RELATED ART

The semiconductor industry is advancing and instruments in this industry are growing to be more sophisticated. However, semiconductors are still extremely sensitive to environmental substances such as moisture and pollutants.

Accordingly, containers used for holding semiconductors, such as pods containing wafers, are expected to be airtight and pollutant-free. Nevertheless, the opening/closing processes of containers provide the opportunity for pollutants to contaminate the internal space of the containers. The containers for wafers are therefore required to be regularly purged to maintain and ensure the transportation quality.

Purge devices have been developed to purge containers. The purge devices are designed to automatically purge containers. However, researches on purge devices are mostly focusing on the purging efficiency of devices rather than personnel safety.

Furthermore, based on economic considerations, the design with independent pipelines for gas and liquid has not been proposed in this field. Conventionally, the liquid used to purge and the gas used to air dry are easily contaminated to each other if one of the system is malfunction and results in uncompleted purging process. Besides, some conventional purge devices only utilize gases at clean dry air (CDA) level.

Moreover, conventional purge devices are in lack of sophisticated manipulations of temperature, and are unable to purge and dry the internal and external of a container simultaneously.

At least one embodiment of the present invention therefore provides an operating method of purge devices for containers to mitigate at least one problem heretofore.

SUMMARY

Some embodiments of the present invention provide an operating method of purge devices for containers to mitigate at least one aforementioned problem. The operating method comprises a step of providing a purge device, a step of removing a lid of the purge device by operating a control panel of the purge device, a step of aligning an opening of a container to a first purging unit and placing the container in the purge device, a step of securing the container with a holder and rotating the container, a step of supplying a purging solution with a first pipeline to a first purging unit and a second purging unit to purge the container, a step of introducing a gas with a second pipeline to the first purging unit and the second purging unit and activating at least one first temperature controller and at least one second temperature controller to dry the container, a step of stopping the rotation of the container, and a step of reopening the lid and transferring the container from the purge device.

Moreover, the operating method further comprises a step of determining the existence of an operator on a stand of the purge device by a detector of the purge device and unlocking the control panel in some other embodiments. More particularly, the step of determining is a step between the step of providing the purge device and the step of removing the lid of the purge device.

DESCRIPTION OF THE PREFERRED EMBODIMENTS

The examples depicted in the following section are provided for the purpose of detailed explanation of the features of preferred embodiments, in order to enable one having ordinary skill in the art to understand the preferred embodiments.

Figure 1:
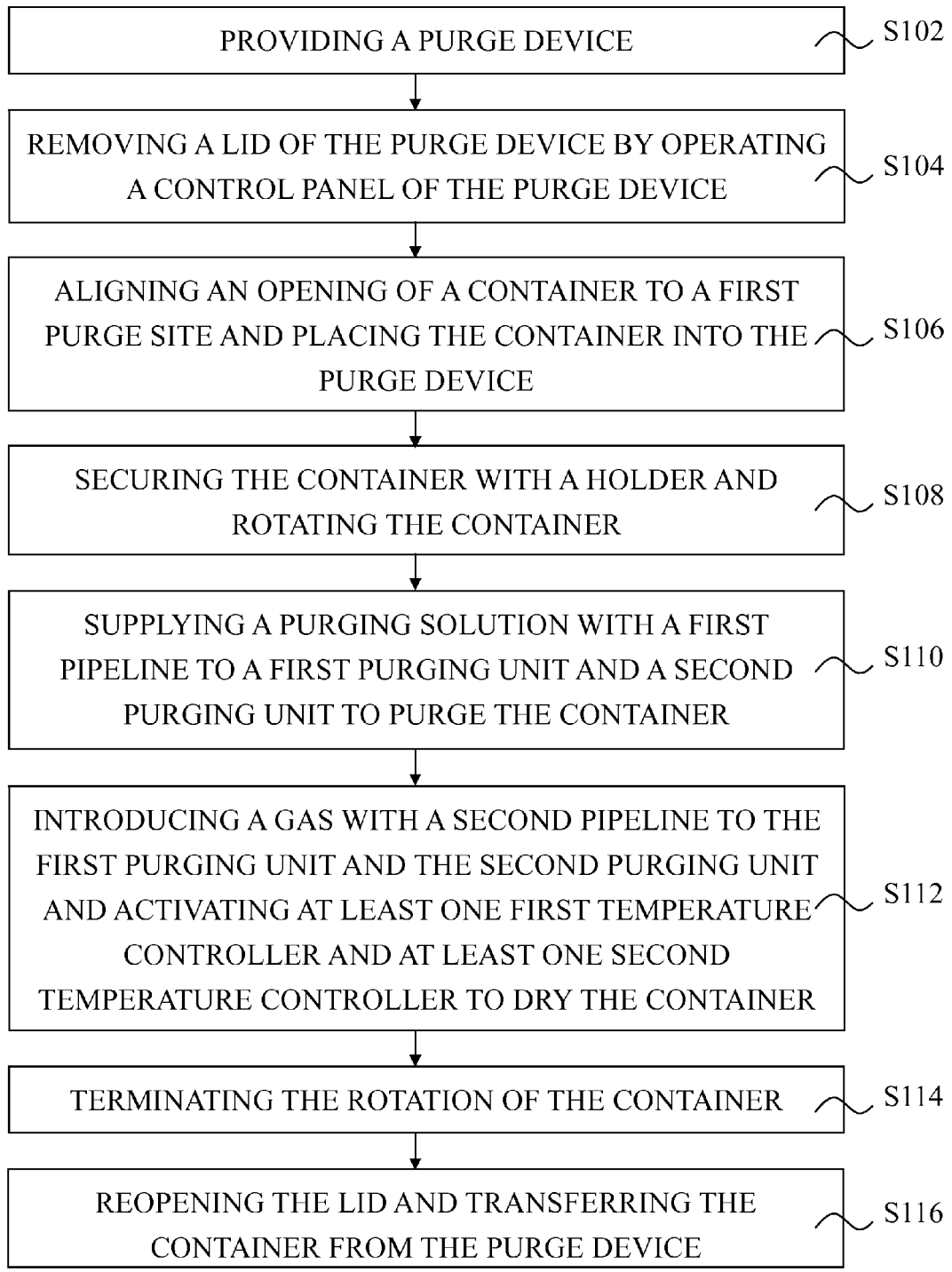
FIG. 1 is a flowchart illustrating an operating method of purge devices for containers, according to some embodiments of the present invention.

FIG. 1 is a flowchart illustrating an operating method of purge devices for containers, according to some embodiments of the present invention. In step S102, a purge device is provided. More particularly, the purge device in step S102 comprises a main case, a control panel, a management box, a lid, a stand, and a detector.

The stand is connected to the main case and is configured for operators to stand on. The stand comprises the detector connected to control panel by internal electrical connections. The detector is configured to unlock the control panel for the operator when the operator is detected as standing on the stand. The detector may be based on bidirectional grating, reflection grating, or diffraction grating.

The control panel is also configured on the main case and comprises an alarm and an emergency button. Once an emergency occurs (e.g., potential damages or ongoing damages to pipelines, the purge device, or personnel), the alarm will be activated to notify the operator by acoustic methods (e.g., buzzer) or visual methods (e.g., a flasher). The arrived operator may then press the emergency button to stop the operation of the purge device.

Figure 2:
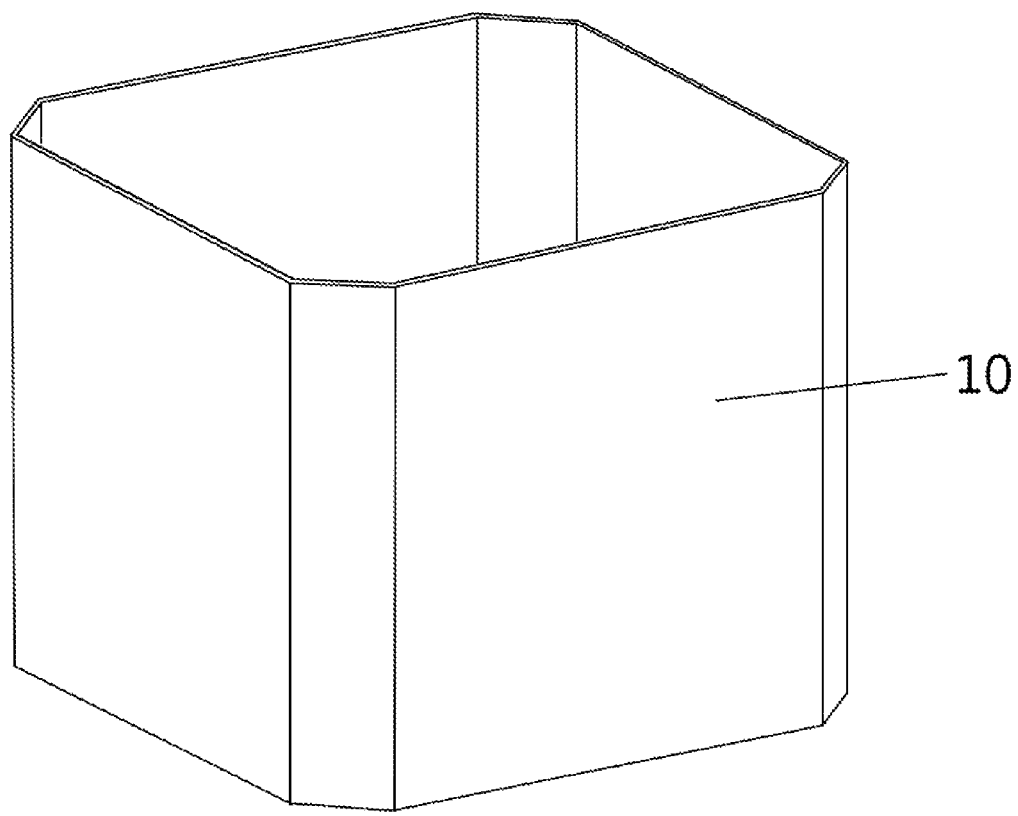
FIG. 2 is a schematic diagram illustrating a core body of purge devices, according to some embodiments of the present invention.

The management box comprises a gas management apparatus, a liquid management apparatus, and a pump. The gas management apparatus is configured to control the movement of gases used to dry containers 60 after the purge process is provided by the purge device. As illustrated in FIG. 2, the purge device is used to purge containers 60 contained in the core body 10. After the purge process, the purge device uses extreme clean dry air (XCDA) or nitrogen to dry the containers.

The liquid management apparatus is configured to control the movement of purging solutions used in the purge process. The purging solutions in the purge process may be water or a mixture of water and a surfactant.

The exemplary purge device in step S102 is used to embody the present invention. However, other purge devices capable of operating the operating methods may be used as alternatives in some other embodiments.

In step S104, the control panel of the purge device is operated to open the lid of the purge device. As disclosed in step S102, the lid is configured on the main case and can be opened by an operator operating the control panel.

Figure 3A:
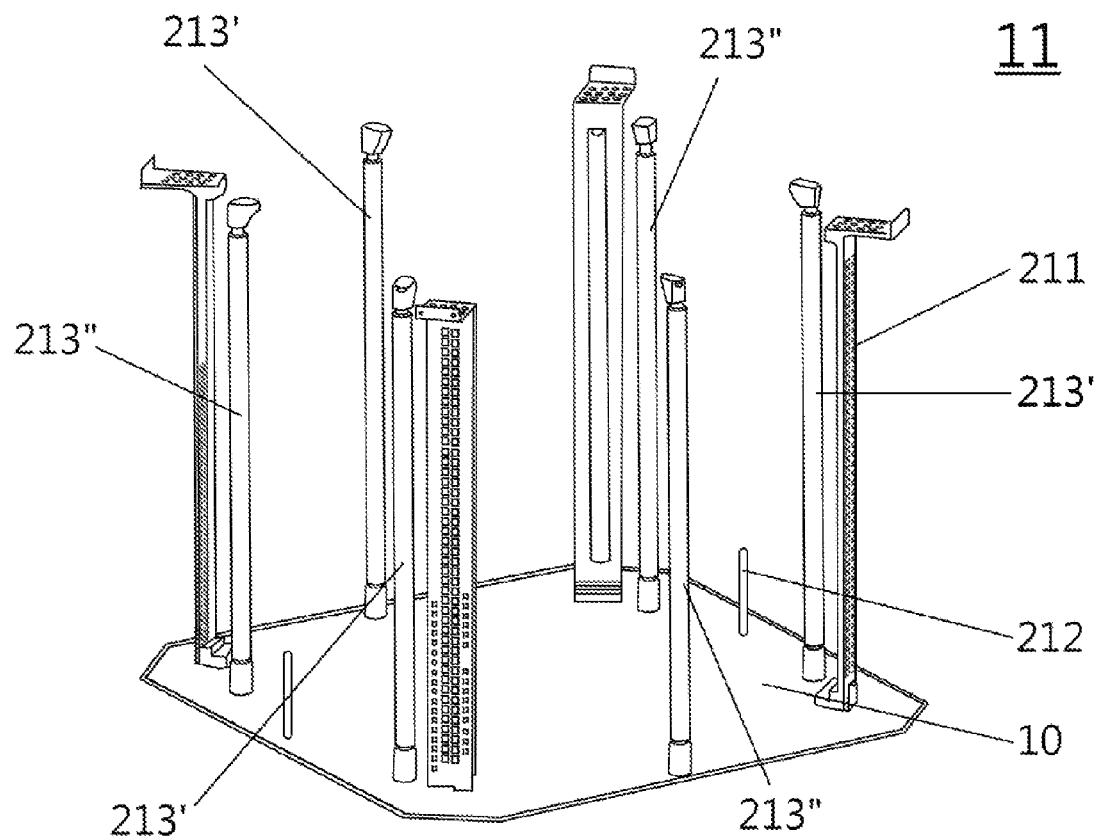
FIG. 3A is a schematic diagram illustrating a second purging unit of a purge device, according to some embodiments of the present invention.
Figure 3B:
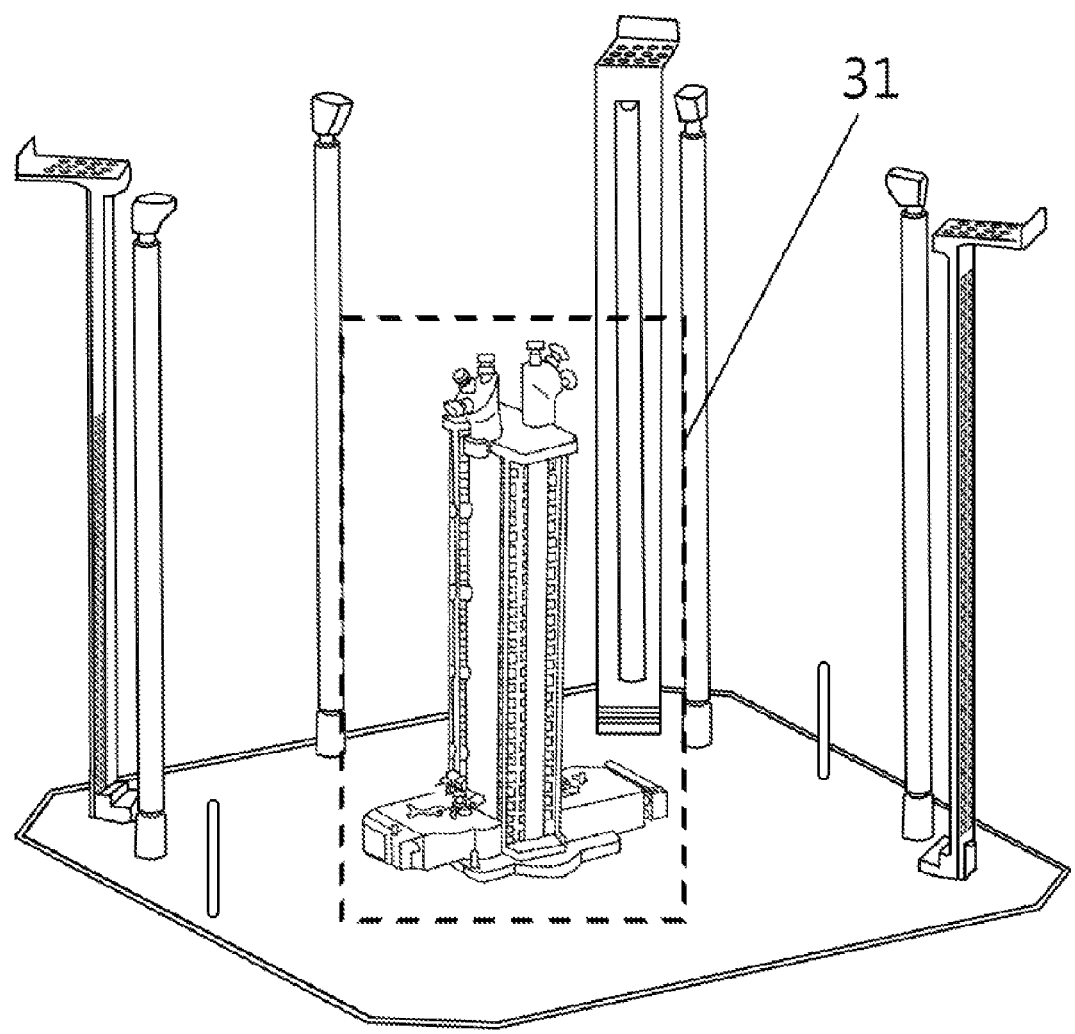
FIG. 3B is a schematic diagram illustrating a first purging unit of a purge device, according to some embodiments of the present invention.
Figure 3C:
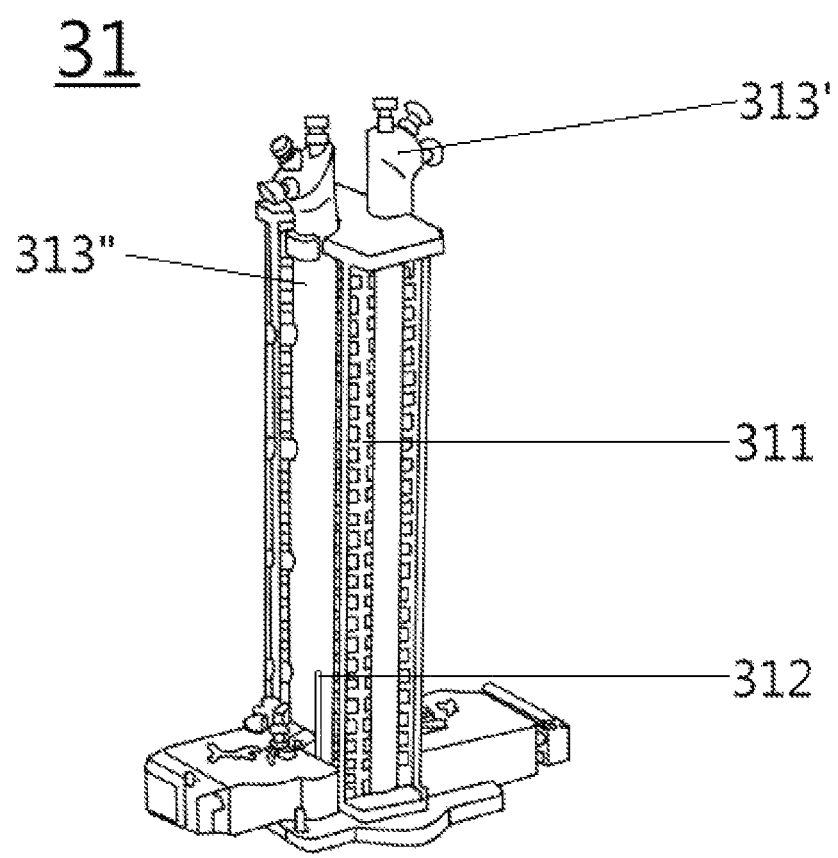
FIG. 3C is a schematic diagram illustrating the structure of a first purging unit, according to some embodiments of the present invention.

In step S106, an opening of the container 60 is aligned to a first purging unit 31 and the container 60 is then placed in the purge device. FIG. 3A-3C illustrated an exemplary purge device. FIG. 3A is a schematic diagram illustrating a second purging unit 11 of the purge device while FIG. 3B is a schematic diagram illustrating the first purging unit 31. And FIG. 3C provides structural details of the first purging unit 31.

The opened lid provides an access to the core body 10 housed inside. FIG. 3A is used to disclose the internal units inside the core body 10 and walls of the core body 10 are thus not shown in FIG. 3A. The core body 10 comprises a second purging unit 11 comprising at least one second temperature controller 221, at least one second temperature sensor, and at least one second purging tube 213.

The at least one second purging tube 213 may be at least one tube for purging solutions 213' or at least one tube for gases 213". The type, number, and constitution of the at least one second purging tube 213 may be varied in different embodiments. Furthermore, each tube for purging solutions 213' comprises a first pipeline and each tube for gases 213" comprises a second pipeline (not shown). The first pipeline is connected to the liquid management apparatus and the second pipeline is connected to the gas management apparatus. The first pipeline is configured to supply purging solutions, in which a purging solution may be water or a mixture of water and a surfactant. The second pipeline is configured to supply gases, in which the gas may be extreme clean dry air (XCDA) or nitrogen. More particularly, the purging solutions are supplied with the first pipeline to the at least one tube for purging solutions 213' and the gases are introduced with the second pipeline to the at least one tube for gases 213".

In some preferred embodiments, the core body 10 comprises four second temperature controllers 211, two second temperature sensors 212, and six second purging tubes 213.

As illustrated in FIG. 3A, the six second purging tubes 213 are constituted by three tubes for purging solutions 213' and three tubes for gases 213". The second temperature controllers 211 are used in step S112 to heat and control the temperature of the internal space of the core body 10 and improve the efficiency of air drying the external walls of the container 60. The second temperature sensors 212 are used to detect the temperature on the external walls of the container 60. If an abnormality (e.g., the external walls are overheated or the temperature is not high enough) is detected, the alarm on the control panel will be activated to warn the personnel. As for the second purging tubes 213, the second purging tubes 213 herein are mainly configured to provide purging solutions and release XCDA or nitrogen to the external walls of the container 60.

The second purging tubes 213 appear to be identical in the embodiments. However, the second purging tubes 213 are configured to performed different actions (e.g., providing purging solutions or gases) in different steps, depending on that the second purging tubes 213 is a tube for purging solutions 213' or a tube for gases 213".

As illustrated in FIGS. 3B and 3C, the first purging unit 31 is configured at the bottom of the core body 10. The first purging unit 31 comprises at least one first temperature controller 311, at least one temperature sensor 312, and at least one first purging tube 313.

In the present embodiment, the first purging unit 31 comprises two first temperature controllers 311, two first temperature sensors 312, and two first purging tubes 313. In some other embodiments, however, the configuration may be modified based on design configurations.

Similar to the at least one second purging tubes 213, the at least one first purging tube 313 may be at least one tube for purging solutions 313' or at least one tube for gases 313". The first purging tubes 313 herein are constituted by a tube for purging solutions 313' and a tube for gases 313".

The at least one first temperature controllers 311 are used to heat and control the temperature of the internal space of the core body 10 and improve the efficiency of air drying the internal space of a container 60. The at least one first temperature sensors 312 are used to detect the temperature inside the container 60. If an abnormality (e.g., the internal space of the container is overheated or the temperature is not high enough) is detected, the alarm on the control panel will be activated to warn the personnel. The at least one first purging tube 313 in the present embodiment is partially different from the at least one second purging tube 213. The number of the at least one first purging tube 313 is less and the at least one first purging tube 313 herein is configured to purge the internal space, used for accommodating semiconductors, of a container 60. Therefore, the at least one first purging tube 313 is expected to provide purging in sophistication. And each first purging tube 313 comprises three nozzles on the top and multiple nozzles on the stem to improve the jetting of purging solutions and gases.

In this embodiment, the first purging tubes 313 and second purging tubes 213 each may be classified as a tube for purging solutions 213', 313' or a tube for gases 213", 313". Each tube for purging solutions 213', 313' comprises the first pipeline connected to the liquid management apparatus, and each tube for gases 213", 313" comprises the second pipeline connected to the gas management apparatus. The first pipeline and the second pipeline are independent to each other. The first pipeline connected with the tubes for purging solutions 213', 313' is configured to supply purging solutions, while the second pipeline connected with the tubes for gases 213", 313" is configured to supply gases.

Figure 4A:
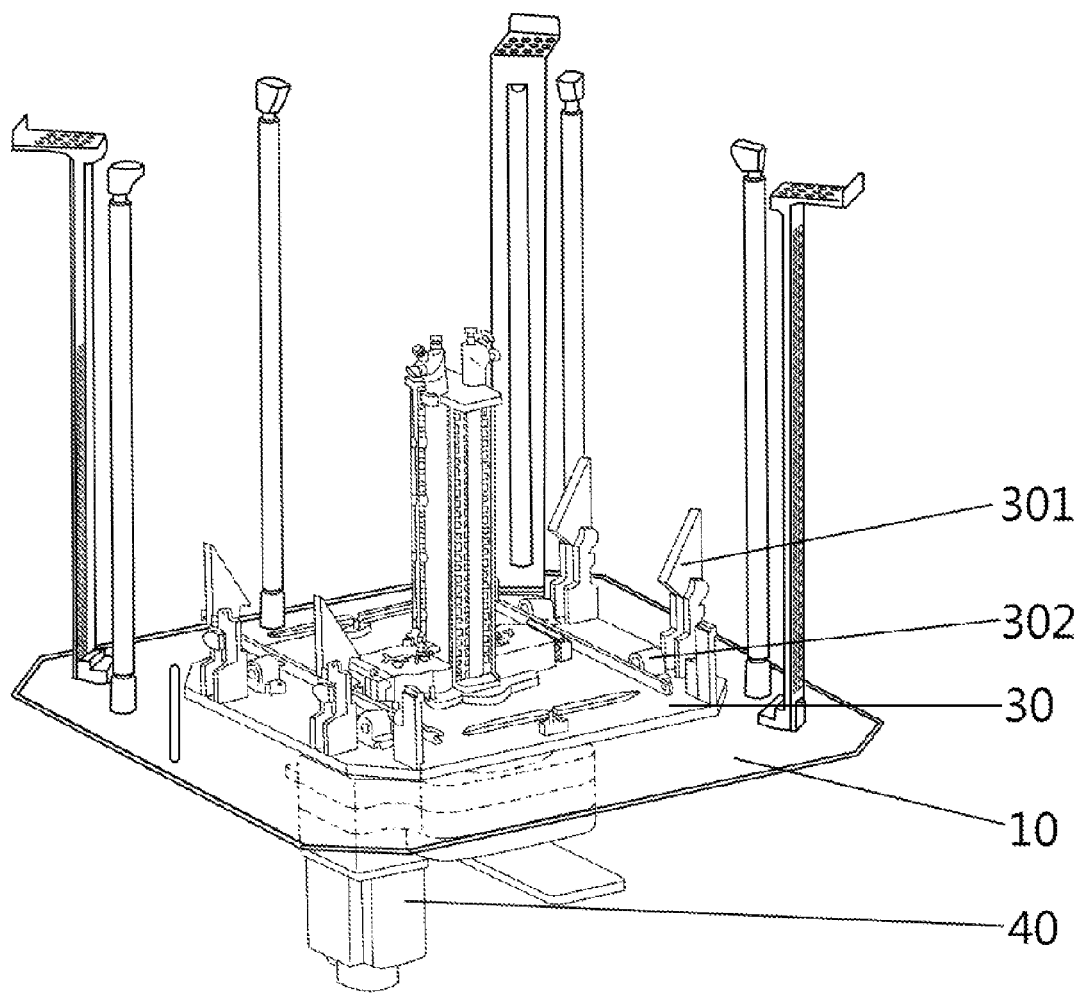
FIG. 4A is a schematic diagram illustrating a rotary table of a purge device, according to some embodiments of the present invention.
Figure 4B:
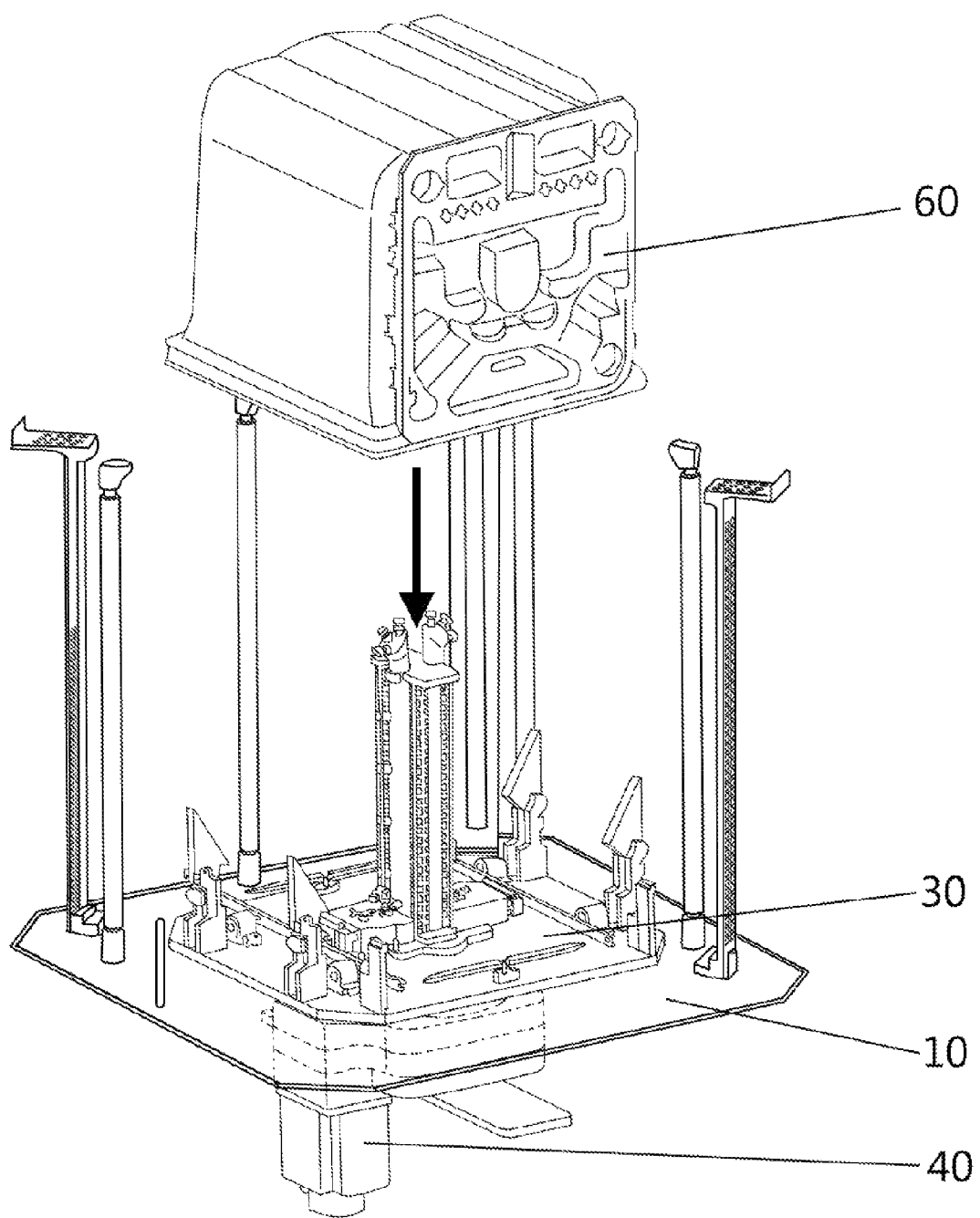
FIG. 4B is a schematic diagram illustrating the mounting of a container into a purge device, according to some embodiments of the present invention.
Figure 4C:
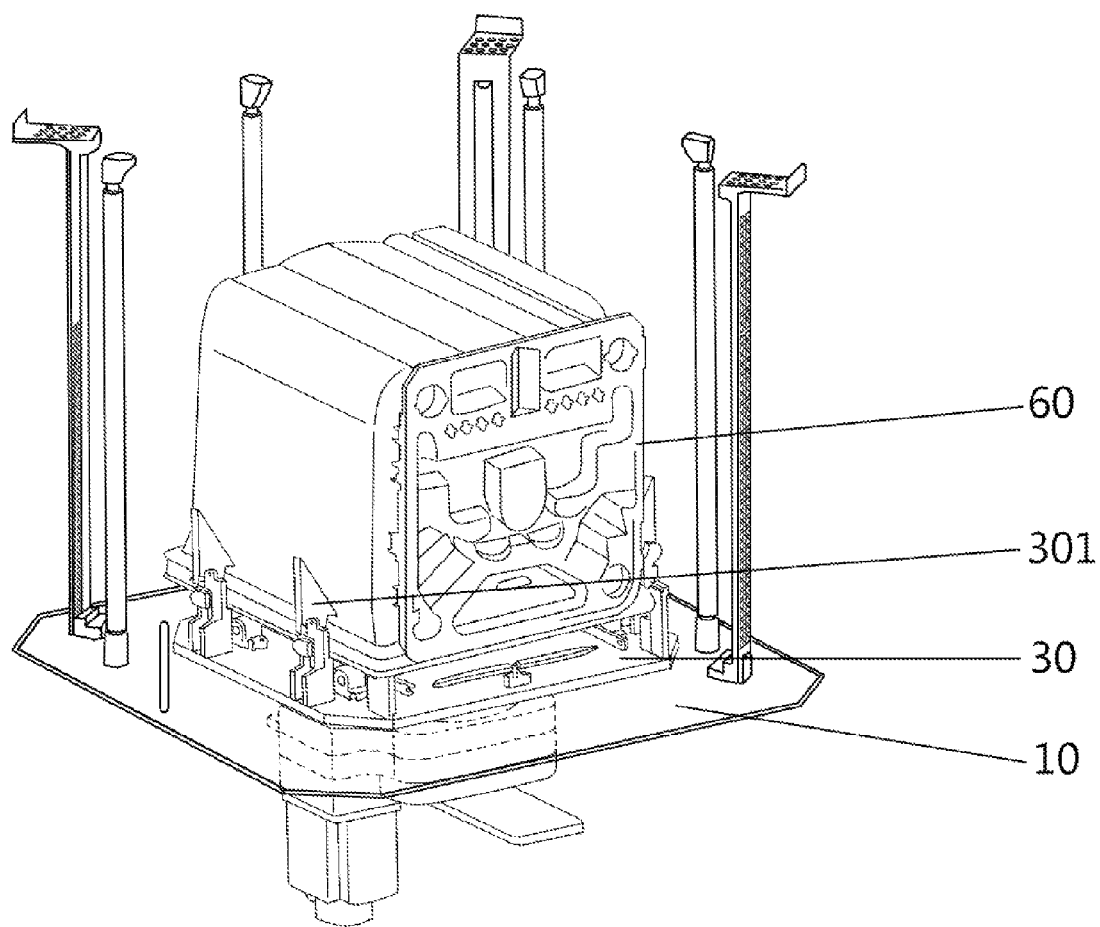
FIG. 4C is a schematic diagram illustrating a mounted container in a purge device, according to some embodiments of the present invention.

In the step S108, the container 60 is secured by a holder and then rotated. Referring to FIG. 4A-4C, in which FIG. 4A illustrates a rotary table of a purge device while FIG. 4B illustrates the mounting of a container into a purge device. And FIG. 4C is a schematic diagram illustrating a mounted container in a purge device.

As illustrated in FIG. 4A, a holder is configured at the bottom of the first purging unit 31. The holder comprises a rotary table 30 and multiple latches 301 and is configured to bear the container 60. Moreover, the rotary table 30 is connected with a motor 40.

More particularly, the rotary table 30 is connected with the motor 40 and a programmable logic controller (PLC). The rotary table 30 cooperates with the PLC to provide optimized control over rotational speed. And the parameters and configurations of the PLC are set up based on operation considerations.

The multiple latches 301 may be configured on the rotary table 30. Each latch 301 may be a spring latch or a pneumatic lock comprising two locks and a pneumatic cylinder. In this embodiment, the rotary table 30 is provided with two pneumatic locks (i.e., four locks with two pneumatic cylinders) and two spring latches. However, the number and constitution of the multiple latches 301 may be varied in some other embodiments.

The latch 301 provides an external mechanism to secure the container 60. In the present embodiment, the locks are actuated by the pneumatic cylinders, through the connecting linkages, to secure the container 60 and prevent the container 60 from slipping away by centrifugal force and being damages. The spring latches beside the container 60 are configured to further secure the container 60 and act as second-line holders in case that the locks are damaged.

FIGS. 4B and 4C illustrate steps S108 and S110 in some embodiments. The opening of the container 60 is aligned to the first purging unit 31 and the container 60 is then placed into the purge device. Subsequently, the container 60 is secured and rotated by the rotary table 30 and the latches.

More particularly, the container 60, opening down, is aligned to the first purging unit 31 and placed in the core body 10. The first purging unit 31 is a column comprising at least one first temperature controller 311, at least one first temperature sensor 312, and at least one purging tube 313. The pneumatic cylinders 302 are then activated to secure two sides of the container 60 by the four locks and the connecting linkage, and two spring latches further secure the other two sides of the container 60. The purge process will be initiated after the container 60 is confirmed to be secured by latches.

Figure 5:
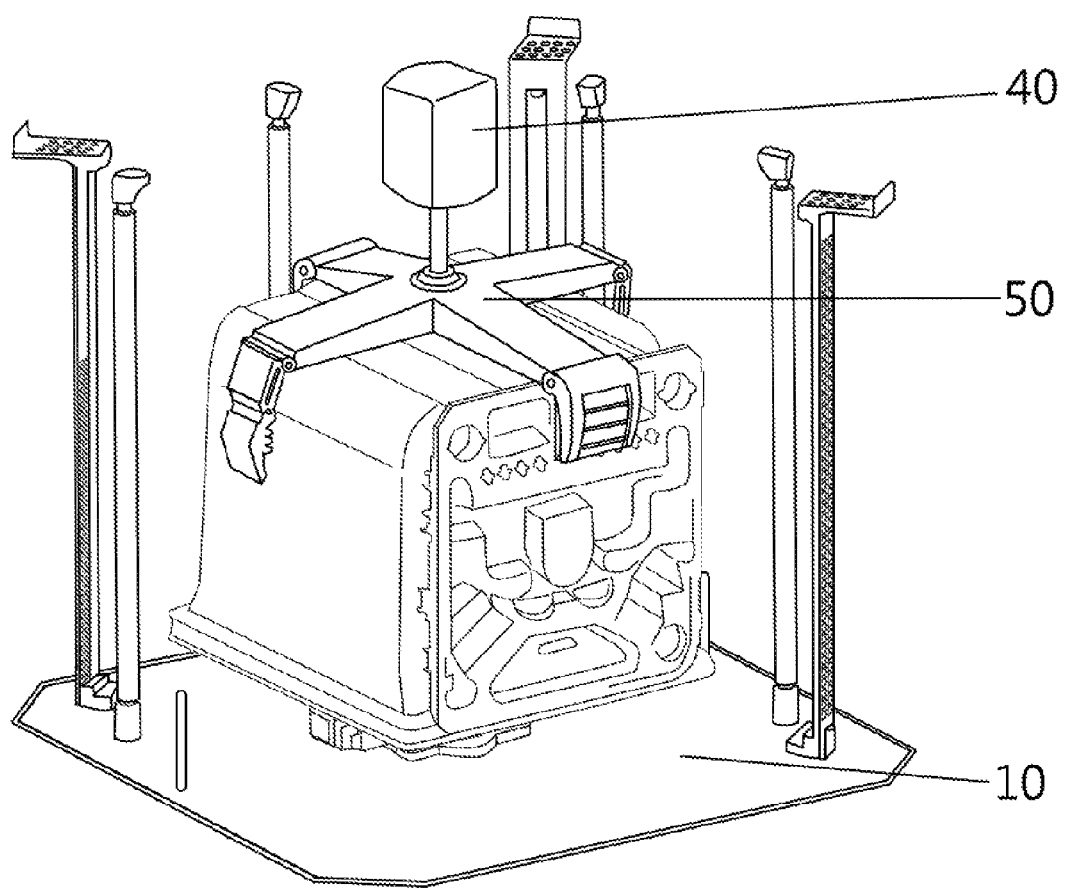
FIG. 5 is a schematic diagram illustrating a clamp of a purge device, according to some embodiments of the present invention.

As illustrated in FIG. 5, the holder may be a clamp 50, rather than the rotary table 30 and the motor 40, in some other embodiments. FIG. 5 is a schematic diagram illustrating a clamp of a purge device, according to some embodiments of the present invention. The clamp in FIG. 5 is connected to a motor 40. The clamp, driving by the motor, is configured to secure and rotate the container 60 in the purge process.

In some other embodiments, the holder 50 may be any instrument capable of securing and rotating the containers 60, such as a cage or a mask.

In step S110, a purging solution is supplied with a first pipeline to both the first purging unit 31 and the second purging unit 11 to purge the container 60. The first purging tubes 313 and the second purging tubes 213, which are inside of and outside of the container 60 respectively, jet high pressure streams of the purging solution at the same time to purge the container 60 in step S110.

The purging solution may be water or a mixture of water and a surfactant. The purging solution is jetted under pressure to remove pollutants, oil, and other substances harmful to wafers.

Figure 6A:
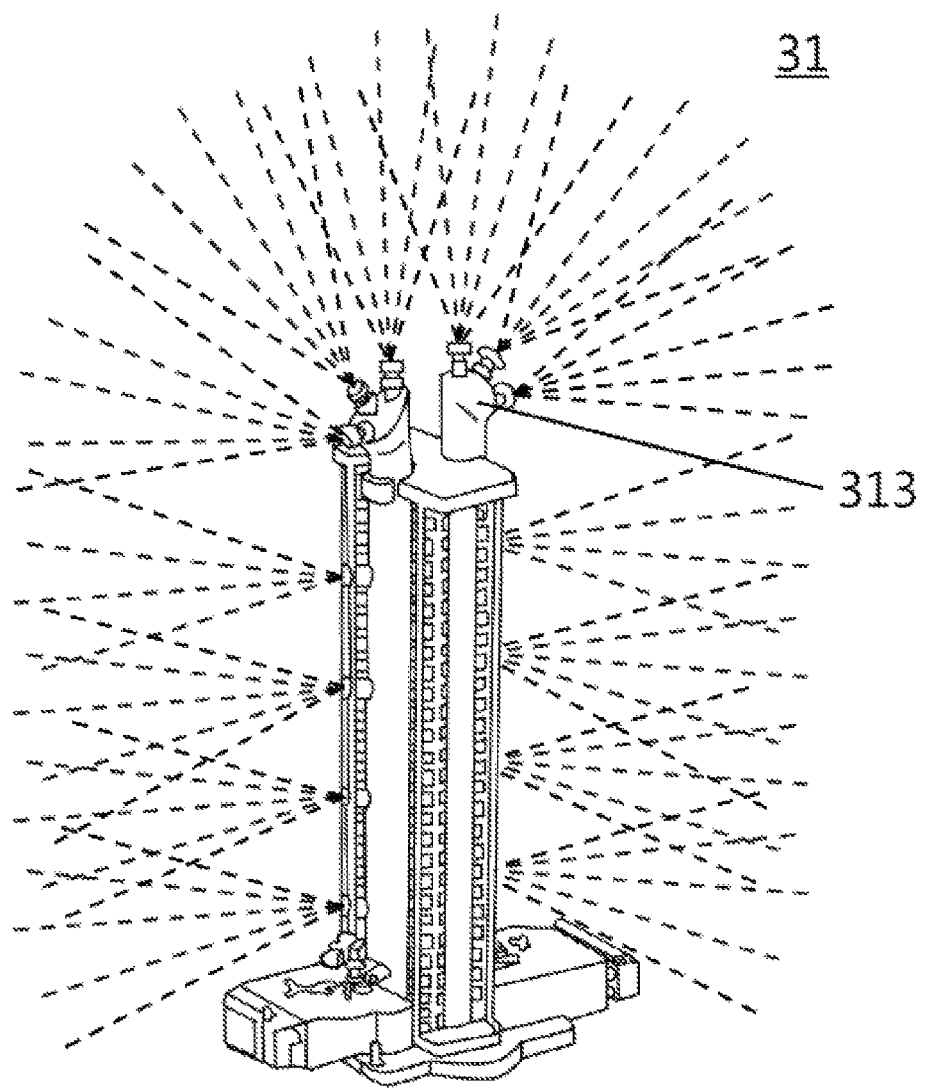
FIG. 6A is a schematic diagram illustrating the working range of a first purging unit, according to some embodiments of the present invention.
Figure 6B:
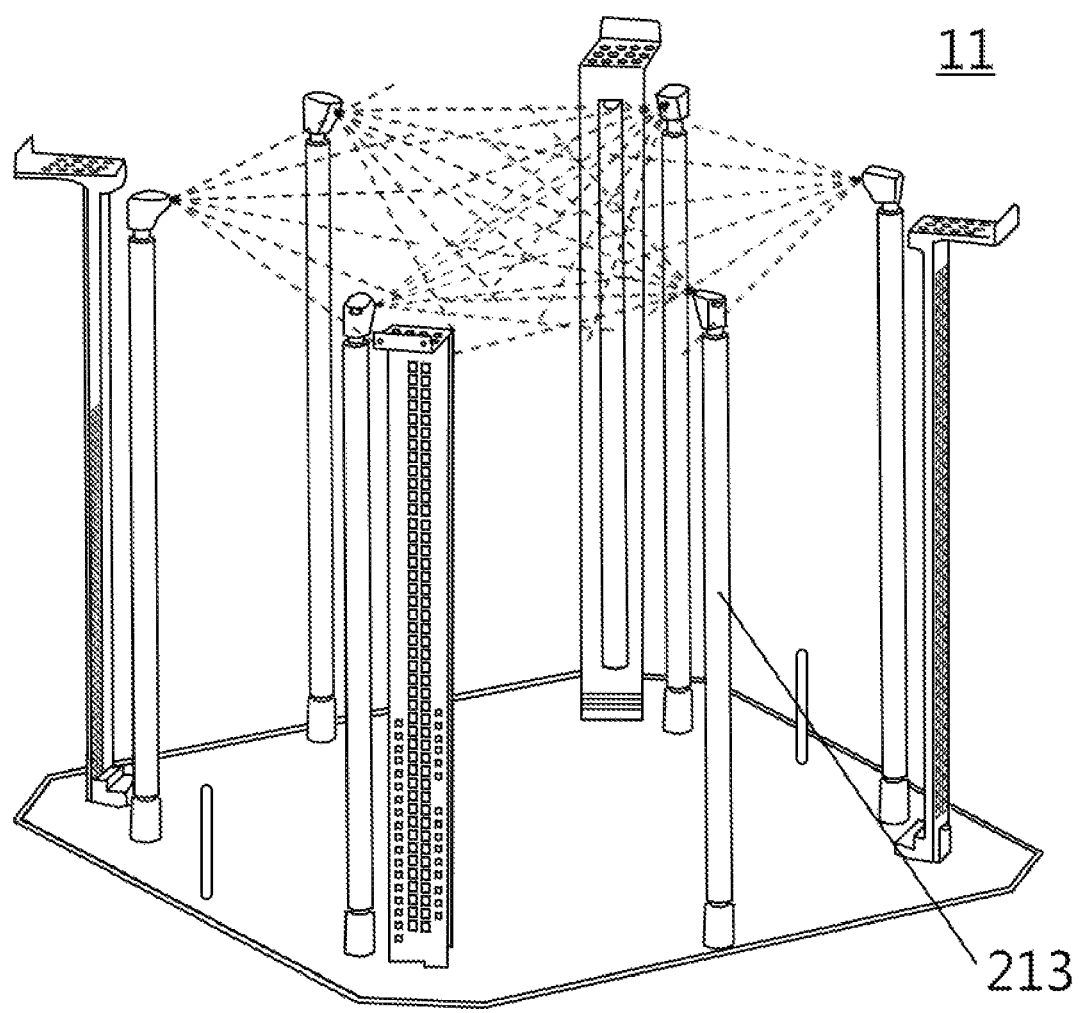
FIG. 6B is a schematic diagram illustrating the working range of a second purging unit, according to some embodiments of the present invention.

Referring to FIGS. 6A and 6B. FIGS. 6A and 6B illustrate the working range of a first purging unit 31 and a second purging unit 11 respectively.

As indicated by the dashed lines in FIG. 6A, steams coming from the tube for purging solutions 313' are intensive and partially overlapped since the first purging tube 313 is configured to purge the internal space of the container 60. In the contrast, the external surface of the container 60 is purged by second purging tubes 213. And streams coming from the tubes for purging solutions 213' (referring to FIGS. 3A and 3B) are indicated by the dashed lines illustrated in FIG. 6B.

In step S112, a gas is fed with a second pipeline to both the first purging unit 31 and the second purging unit 11 and the at least one first temperature controller 311 and the at least one second temperature controller 211 are activated, in order to dry the container 60.

More particularly, the gas is jetted by the tube for gases 313" of the at least one first purging tube 313 and the tube for gases 213" of the at least one second purging tube 213. The air streams coming from the tube for gases 313" (referring to FIGS. 3A and 3B) and the tube for gases 213" are indicated by the dashed lines illustrated in FIGS. 6A and 6B.

In step S112, the at least one second temperature controller 311, the at least one second temperature sensor 212, and the second purging tubes coordinate to perform the drying process. That is, when the second purge tubes 213 is jetting streams of gases, such as XDCA or nitrogen, the second temperature controller 211 provides thermal energy and the second temperature sensor 212 monitors the temperature of the external surface of the container 60 and examines whether the temperature is maintain at a proper degree for the drying process.

Similarly, the first temperature controller 311, the first temperature sensor 312 and a first purging tube 313 coordinate to dry the internal space of the container 60. More particularly, when the first purge tubes 313 is jetting streams of XCDA or nitrogen, the first temperature controller 311 provides thermal energy and the first temperature sensor 312 monitors the temperature of the internal space of the container 60 and examines whether the temperature is maintain at a proper degree for the drying process. In the present embodiment, the first purging tube 313 and the multiple nozzles of the first purging tube 313 further comprises nozzles for gases, in which the gas is introduced with the second pipeline to the nozzles for gases.

In step S114, rotation of the container 60 is stopped. Once the rotation is stopped, the container 60 may be examined by the purge device to confirm whether the drying process is finished. The examination result may then display on the control panel for the operator. In step S116, the lid is reopened and the container 60 is transferred from the purge device. For example, the operator may use the control panel to remove the lid and transferred the container 60 from the purge device and finish the purging process.

In the present embodiment, the operating method further comprises a step of determining between the step of providing the purge device and the step of removing the lid of the purge device. The step of determining is that a detector of the purge device determines the existence of an operator on a stand of the purge device and unlocking the control panel. The step of determining is to ensure that the operator is standing on the stand, controlling the purge device, and unlocking the control panel during the purge process for containers 60. The operator may control the purge device only after the control panel is unlocked.

The operating methods of purge devices for containers in at least one embodiment provide a safer environment for workers. Furthermore, the purge devices provide independent pipelines for purging solutions and gases respectively and disposed purging tubes both outside and inside of a container. The operating methods therefore use water or a mixture of water and a surfactant and XDCA or nitrogen to purge the container 60.

There are many inventions described and illustrated above. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, many of those permutations and combinations will not be discussed separately herein.

What is claimed is:

1. An operating method of purge devices for containers, comprising the steps of:
   providing a purge device;
   removing a lid of the purge device by operating a control panel of the purge device;
   aligning an opening of a container to a first purging unit and placing the container into the purge device;
   securing the container with a holder and rotating the container;
   supplying, with a first pipeline, a purging solution to a first purging unit and a second purging unit to purge the container;
   introducing, with a second pipeline, a gas to the first purging unit and the second purging unit and activating at least one first temperature controller and at least one second temperature controller to dry the container;
   stopping the rotation of the container; and
   reopening the lid and transferring the container from the purge device.

2. The operating method of purge devices for containers as claimed in claim 1, wherein the operating method further comprises a step of determining between the step of providing the purge device and the step of removing the lid of the purge device, wherein the step of determining is:
   determining, by a detector of the purge device, the existence of an operator on a stand of the purge device and unlocking the control panel.

3. The operating method of purge devices for containers as claimed in claim 1, wherein the purging solution is water or a mixture of water and a surfactant.

4. The operating method of purge devices for containers as claimed in claim 1, wherein the gas is extreme clean dry air (XCDA) or nitrogen.

5. The operating method of purge devices for containers as claimed in claim 1, wherein the first purging unit comprises at least one first temperature sensor, at least one first purging tube, and the at least one first temperature controller.

6. The operating method of purge devices for containers as claimed in claim 5, wherein the second purging unit comprises at least one second temperature sensor, at least one second purging tube, and the at least one second temperature controller.

7. The operating method of purge devices for containers as claimed in claim 5, wherein the at least one first purging tube are at least one tube for purging solutions and at least one tube for gases, and wherein the purging solution is supplied from the first pipeline to the at least one tube for purging solutions while the gas is introduced from the second pipeline to the at least one tube for gases.

8. The operating method of purge devices for containers as claimed in claim 6, wherein the at least one second purging tube are at least one tube for purging solutions and at least one tube for gases, and wherein the purging solution is supplied from the first pipeline to the at least one tube for purging solutions while the gas is introduced from the second pipeline to the at least one tube for gases.

9. The operating method of purge devices for containers as claimed in claim 1, wherein the holder is a rotary table comprising multiple latches.

10. The operating method of purge devices for containers as claimed in claim 1, wherein the holder is a clamp.

* * * * *